(12) United States Patent
Abe et al.

(10) Patent No.: US 7,109,966 B2
(45) Date of Patent: Sep. 19, 2006

(54) DISPLAY ELEMENT DRIVE CIRCUIT AND DISPLAY DEVICE

(75) Inventors: Shinichi Abe, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 431 days.

(21) Appl. No.: 10/614,104

(22) Filed: Jul. 8, 2003

(65) Prior Publication Data
US 2004/0021652 A1 Feb. 5, 2004

(30) Foreign Application Priority Data
Jul. 12, 2002 (JP) ............... 2002-203896

(51) Int. Cl.
G09G 3/36 (2006.01)
G09G 3/30 (2006.01)
G09G 3/10 (2006.01)
G02F 1/136 (2006.01)

(52) U.S. Cl. ............... 345/100; 345/76; 345/204; 315/169.3; 349/42

(58) Field of Classification Search ............... 345/204, 345/87–100; 349/42–48; 326/85; 327/112
See application file for complete search history.

(56) References Cited

U.S. PATENT DOCUMENTS 6,043,812 A * 3/2000 Utsunomiya et al. ....... 345/204
6,661,397 B1 * 12/2003 Mikami et al. ............... 345/76
6,753,654 B1 * 6/2004 Koyama ................ 315/169.1
6,774,882 B1 * 8/2004 Yamazaki et al. ........... 345/98
2002/0093495 A1 * 7/2002 Akimoto et al. ............ 345/204

FOREIGN PATENT DOCUMENTS

| JP | 03-088420 | 4/1991 |
|---|---|---|
| JP | 03-143017 | 6/1991 |
| JP | 05-167424 | 7/1993 |
| JP | 05-218847 | 8/1993 |
| JP | 06-132806 | 5/1994 |
| JP | 09-214324 | 8/1997 |
| JP | 10-112391 | 4/1998 |
| JP | 11-317653 | 11/1999 |
| JP | 2003 234655 | 8/2003 |

* cited by examiner

*Primary Examiner*—Richard Hjerpe
*Assistant Examiner*—M. Fatahiyar
(74) *Attorney, Agent, or Firm*—Mattingly, Stanger, Malur & Brundidge, P.C.

(57) ABSTRACT

A CMOS circuit comprises a first transistor of P channel type, a second transistor of N channel type and a drive circuit for driving the first and second transistors. The drive circuit includes a time constant circuit having a first time constant utilizing a first gate input capacitance of the first transistor (parasitic capacitance between a gate and a source of the first transistor) and a second time constant utilizing a second gate input capacitance of the second transistor (parasitic capacitance between a gate and a source of the second transistor). Either one of the first and second time constants of the time constant circuit is selected by turning either one of the first and second transistors ON after the other transistor OFF, when the drive circuit receives a predetermined logic signal.

24 Claims, 4 Drawing Sheets

DISPLAY ELEMENT DRIVE CIRCUIT AND DISPLAY DEVICE

BACKGROUND OF THE INVENTION

1. Field of the Invention

The present invention relates to a display element drive circuit and a display device and, in particular, the present invention relates to an organic EL element drive circuit, which can reduce power consumption by restricting a feed-through current of a CMOS output stage of a current drive circuit for current-driving an organic EL element and an improvement of an organic EL display device.

2. Description of the Prior Art

It has been known that an organic EL display device, which realizes a high luminance display by spontaneous light emission, is suitable for a display on a small display screen and the organic EL display device has been attracting public attention as the next generation display device to be mounted on a portable telephone set, a PHS, a DVD player or a PDA (Personal Digital Assistants), etc. Known problems of such organic EL display device are that, since, when it is driven by voltage as in a liquid crystal display device, luminance variation thereof becomes substantial and that, since there is difference in sensitivity of organic EL element between R (red), G (green) and B (blue), a control of luminance of a color display becomes difficult.

In view of these problems, an organic EL display device using current drive circuits has been proposed recently. For example, JPH10-112391A discloses a technique in which the luminance variation problem is solved by employing a current drive system.

An organic EL display panel of an organic EL display device for a portable telephone set, a PHS, etc., having 396 (=132×3) terminal pins for column lines and 162 terminal pins for row lines has been proposed. However, there is a tendency that the number of column lines as well as row lines is further increased.

An output stage of a current drive circuit of such organic EL display panel of either the active matrix type or the passive matrix type includes a current source drive circuit, such as an output circuit constructed with a current mirror circuit, for each of the terminal pins. In, for example, U.S. patent application Ser. No. 10/102,671, which corresponds to JP2002-82662 claiming domestic priorities of JP2001-86967 and JP2001-396219, a drive stage includes a parallel-driven current-mirror circuit (reference current distribution circuit) having output side transistors the number of which corresponds to the number of terminal pins and drives the output circuit by generating a corresponding number of mirror currents on the basis of a reference current supplied from a reference current generator circuit provided precedent to an input of the drive stage and distributing these mirror currents to the respective terminal pins. Alternatively, the mirror currents distributed to the terminal pins are amplified by k times (k is an integer equal to or larger than 2) and drive the output circuits. The k-time amplifier circuit is disclosed in JP2002-33719 assigned to the assigned to the assignee of this application, in which a D/A converter circuit is provided for each terminal pin. In the k-time amplifier circuit, the D/A converter circuits corresponding to the respective column side terminal pins receive display data and column side drive currents for the respective terminal pins are generated simultaneously by A/D converting the column data.

It is general, in the organic EL display device, that one of the column side (anode side of the organic EL element) lines becomes the current discharge side and the row side (cathode side of the organic EL element) lines becomes the current sink side. Drive currents from the column side current drive circuits are supplied to the anode side of the organic EL elements (referred to as "OEL elements", hereinafter) correspondingly to the row side scan. The cathode side of the OEL element is grounded through CMOS push-pull circuits to sink the drive currents.

Since the OEL element is a capacitive element, a portion of the drive current is accumulated in the OEL element as electric charge. Therefore, in the display device having matrix-arranged OEL elements, charges may flow from the OEL elements arranged in the peripheral portion, which are not to be scanned into the OEL element, which is to be scanned. Consequently, there is a problem that the OEL elements, which are not scanned, emit light and/or the luminance of the driven OEL elements varies, resulting in erroneous light emission.

Figure 4:
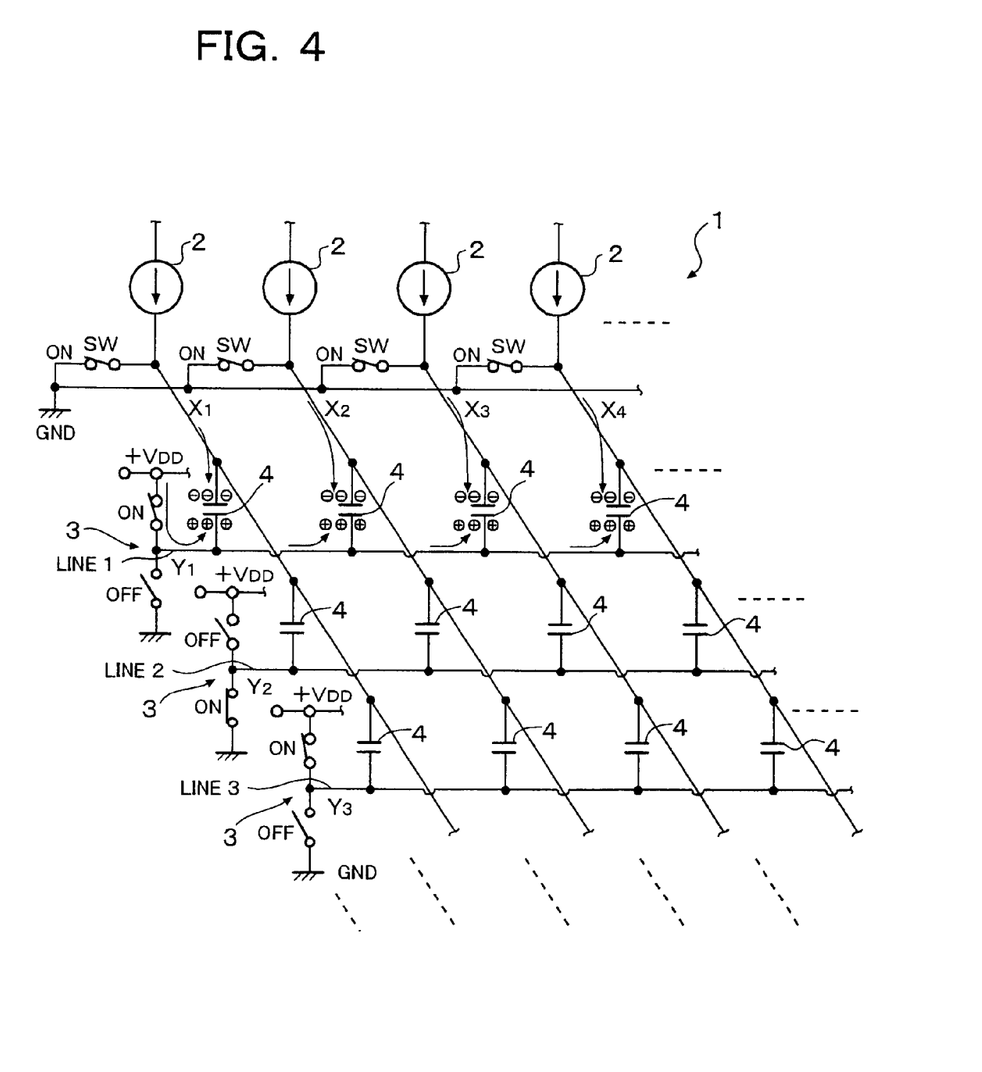
FIG. 4 schematically shows a general organic EL display panel.

FIG. 4 schematically shows a general organic EL display panel 1 of an organic EL display device. The organic EL display panel 1 includes matrix-arranged OEL elements 4, column side current drive circuits 2 and row side drive circuits 3. In FIG. 4, the OEL elements 4 are shown as capacitors and a CMOS push-pull circuit of the drive circuit 3 is shown as a pair of series-connected switches, for convenience.

In the organic EL display panel 1, in order to improve the luminance of the OEL elements and to prevent the luminance thereof from being varied, the OEL elements 4 are preliminarily charged for a constant time, which is determined by the junction capacitances of the OEL elements 4. Therefore, switch circuits SW each provided between the column side current drive circuit 2 and the ground line are made ON for a constant time before the drive is started, to discharge electric charges of the OEL elements 4 to thereby reset the OEL elements. The resetting of the OEL elements is performed by making the switch circuits SW ON for an initial constant time for which a row side line of the row side drive circuit 3, which is to be scanned, becomes low (L) level to ground anode side lines (column lines) X1, X2, X3, . . . connected to outputs of the current drive circuits 2. Thus, residual charge of the OEL elements 4 is discharged and, thereafter, the output currents of the column side current drive circuits 2 are supplied to the OEL elements 4. In the row side drive circuits 3, the OEL elements 4, which are to be not scanned, are reverse-biased. Otherwise, the drive current flows in the OEL element 4, which is to be scanned, also flows into other OEL elements arranged around the OEL element 4, causing the erroneous light emission. Therefore, the cathode side lines (row lines) Y1, Y2, Y3, . . . , which are to be scanned, are fixed to high (H) level.

Figure 5:
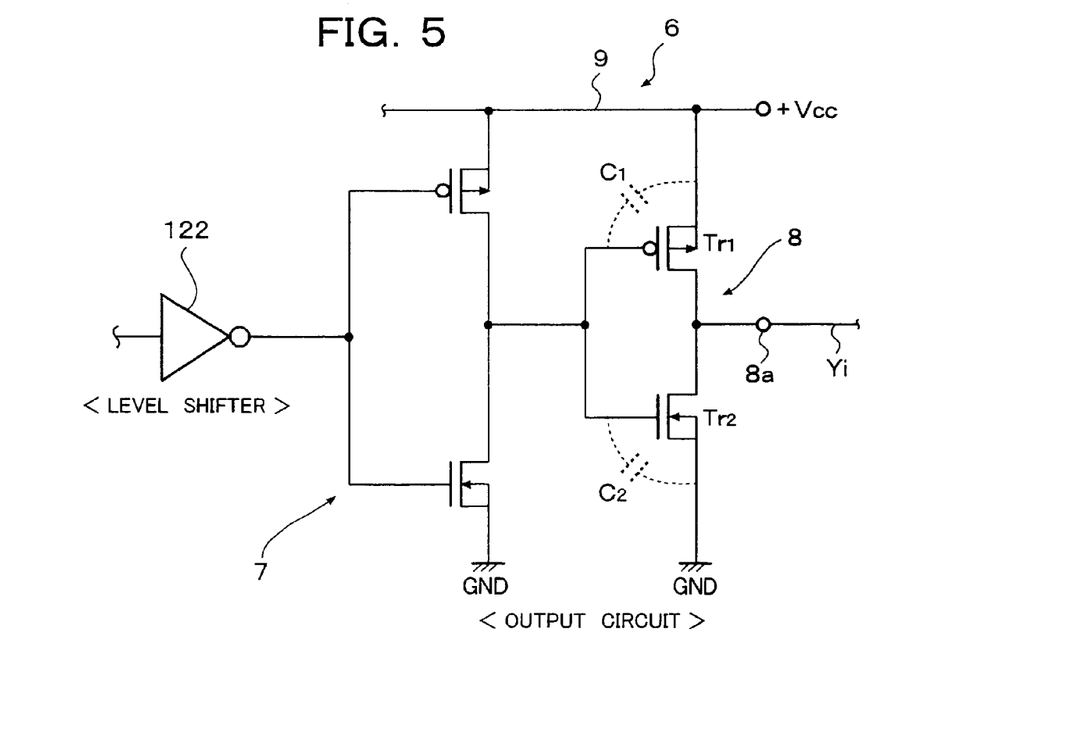
FIG. 5 is a block circuit diagram of an example of the row side current drive circuit of the display panel shown in FIG. 4.

As shown in FIG. 5, a level shifter 5 of the CMOS push-pull circuit of the row side drive circuit 3 receives a logic signal having logic values "L" level and "H" level, which are about 0V and 3V, respectively, or "1" and "0", respectively, and generated according to a vertical scan through a gate circuit, etc., (not shown). The logic signal is level-shifted to about 0V and 20V by the level shifter 5 and the level-shifted logic signal having "H" and "L" levels is inputted to an inverter 7 of an input stage of the output circuit 6 and drives a CMOS output stage 8, which operates by a voltage (=20V) of the high power source line 9 (+Vcc) through the inverter 7. Incidentally, reference numeral 8a is an output terminal of the CMOS output stage 8, which is connected to a row side scan line Yi.

In this case, since a P channel transistor Tr1 in an upstream side reverse-biases the OEL element 4, its ON resistance is as high as, for example, several hundreds ohms and a parasitic capacitance C1 between a gate and a source thereof is small.

The parasitic capacitance between the gate and source thereof or a parasitic capacitance between the gate and a substrate has a substantial influence as a gate input capacitance. Therefore, the gate input capacitance will be described with reference to the parasitic capacitance between the gate and the source as a representative.

On the other hand, since a downstream side N channel transistor Tr2 receives a drive current from one of the OEL elements 4 connected to the row line, an area size thereof is large and its ON resistance is as small as several ohms. Therefore, the parasitic capacitance C2 between a gate and a source thereof becomes large correspondingly.

If the downstream side transistor Tr2 has such large parasitic capacitance C2, a transition characteristics thereof when the transistor Tr2 is changed from ON to OFF becomes gentle and, therefore, there is a problem that, when the upstream side transistor Tr1 is turned ON, a feed-through current flows from the power source line 9 to ground GND through the transistor Tr1 and the turned OFF transistor Tr2.

Since the power source voltage of the power source line 9 is as high as about 20V, the feed-through current becomes as large as several tens mA, causing power consumption to be increased together with risk of destruction of the driver IC.

Since the parasitic capacitance C2 of the transistor Tr2 in the row side drive circuit 3 having the transistors Tr1 and Tr2 having substantially different size ratio (area ratio of the gate to the source) is large, the usual countermeasures for the feed-through current by providing resistors and/or bypass circuit, etc, is not enough.

SUMMARY OF THE INVENTION

An object of the present invention is to provide a display element drive circuit, which is capable of reducing power consumption by restricting a feed-through current in a CMOS output stage of a current drive circuit, and a display device using the same.

In order to achieve the above object, a display element drive circuit having an output stage including a CMOS circuit, which drives a line to which a plurality of display elements are connected, according to the present invention, is featured by that the CMOS circuit comprises a first transistor of P channel type, a second transistor of N channel type and a drive circuit for driving the first and second transistors, the drive circuit includes a time constant circuit having a first time constant utilizing a first gate input capacitance of the first transistor (parasitic capacitance between a gate and a source of the first transistor) and a second time constant utilizing a second gate input capacitance of the second transistor (parasitic capacitance between a gate and a source of the second transistor), wherein either one of the first and second time constants of the time constant circuit is selected by turning either one of the first and second transistors OFF and the other transistor ON when the drive circuit receives a predetermined logic signal.

The ON/OFF of the first and second transistors is determined in relation to gate threshold values of the respective transistors. In the present invention, the gate input capacitances of the first and second transistors (parasitic capacitances between the gates and the source thereof) are utilized. When the drive circuit for driving the CMOS circuit receives one of the logic signal "H" and "L" and the CMOS circuit outputs "H" output, the second transistor is turned OFF corresponding to the second time constant of the time constant circuit and then the first transistor is turned ON correspondingly to the first time constant thereof. By turning the second transistor OFF first, it is possible to block the feed-through current flowing from the power source side of the CMOS circuit to the ground side when the CMOS circuit outputs the "H" signal.

Alternatively, one of the first and second time constants is selected in such a way that the second transistor is turned ON after the first transistor is turned OFF. Therefore, it is possible to block the feed-through current from the power source side of the CMOS circuit to the ground GND when the CMOS circuit outputs "L".

Incidentally, a circuit for providing a third and fourth time constants may be provided in the time constant circuit. In such case, the second transistor is turned ON after the first transistor is turned OFF, by turning the first transistor OFF according to the third time constant and turning the second transistor ON according to the fourth time constant, when the CMOS circuit outputs "L" in response to "H" or "L" logic signal received by the drive circuit, Therefore, it is possible to block the feed-through current from the power source side of the CMOS circuit to the ground GND.

As a result, it is easily possible to realize a display element drive circuit capable of reducing power consumption and a display device using the same when the CMOS circuit is driven, particularly, when the CMOS circuit outputs "H".

DETAILED DESCRIPTION OF THE PREFERRED EMBODIMENTS

Figure 1:
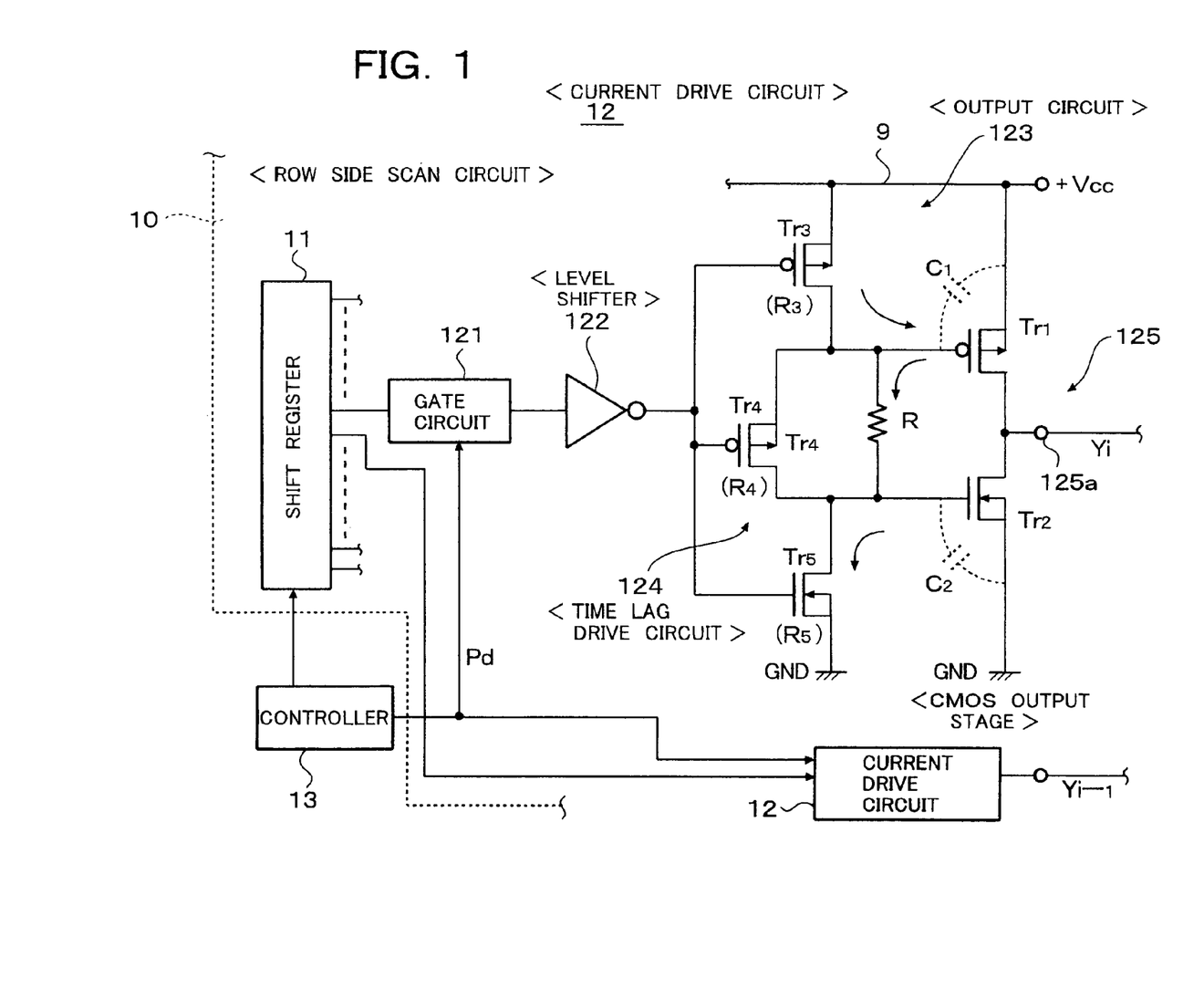
FIG. 1 is a block circuit diagram of a row side scan circuit of an EL element drive circuit including a row side current drive circuit, according to an embodiment of the present invention.

FIG. 1 shows a row side scan circuit 10 constructed with a shift register 11 and current drive circuits 12, which operate upon outputs from respective stages of the shift register 11.

The shift register 11 is controlled by one-data for vertical scan from a controller 15. The current drive circuits 12 are provided for row side lines Y1, Y2, ..., Yi-1 and Yi, respectively, to current-drive the latter lines. Incidentally, only one current drive circuit 12 for the row side line Yi is shown in FIG. 1.

The current drive circuit 12 receives a discharge pulse signal Pd from a controller 13 and is constructed with a gate circuit 121, which receives an output of the shift register 11, a level shifter 122, which shifts a level of the output "H" or "L" of the gate circuit 121, and an output circuit 123, which receives a "H" or "L" signal from the level shifter 122.

The output circuit 123 is constructed with a time lag drive circuit (time constant circuit) 124 as an input stage and a CMOS output stage 125 driven by the time lag drive circuit 124 and generates a time lag between an OFF drive of a downstream side N channel transistor Tr2 and an ON drive of an upstream side P channel transistor Tr1 of the CMOS output stage 125 by the time lag drive circuit 124.

Incidentally, the level shifter 122 corresponds to the level shifter 5 shown in FIG. 5 and the CMOS output stage 125 corresponds to the CMOS output stage 8 shown in FIG. 5. In FIG. 1, a reference numeral 125a shows an output terminal of the CMOS output stage 125, which corresponds to the output terminal 8a shown in FIG. 5.

When the "H" signal is to be generated at the output terminal 125a, the output at the output terminal 125a is changed from "L" to "H". That is, drive signals for turning the transistor Tr2 of the CMOS output stage 125 OFF and then turning the transistor Tr1 thereof ON are generated by driving the transistors Tr1 and Tr2 through different time constant circuits by the time lag drive circuit 124 of the current output circuit 123. Thus, a time lag between the ON state and the OFF stage of the transistors is given.

On the other hand, when the "L" signal is to be generated at the output terminal 125a, the output at the output terminal 125a is changed from "H" to "L". That is, drive signals for turning the transistor Tr1 of the CMOS output stage 125 OFF and then turning the transistor Tr2 thereof ON are generated by driving the transistors Tr1 and Tr2 through different time constant circuits by the time lag drive circuit 124 of the current output circuit 123. Thus, a time lag between the ON state and the OFF stage of the transistors is given.

Figure 2:
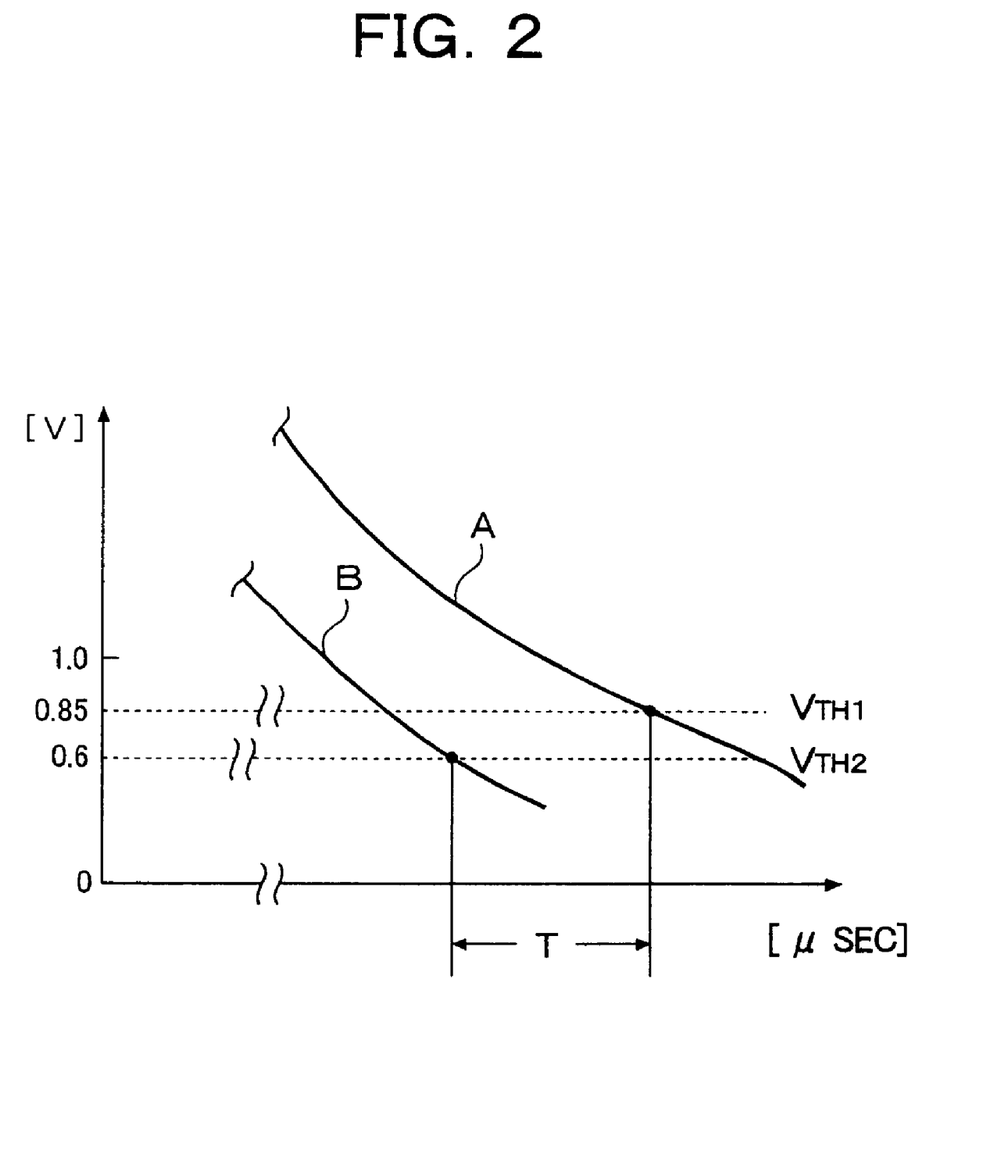
FIG. 2 is a graph illustrating a driving operation of a CMOS output stage of a time lag drive circuit.

FIG. 2 is a graph illustrating the drive operation of the time lag drive circuit 124.

It is considered that the gate input voltage is changed from "H" to "L" (when the "H" signal is to be generated at the output terminal 125a) in a case where a gate threshold voltage VTH1 for ON/OFF operating the transistor Tr1 is 0.85V and a gate threshold voltage VTH2 for ON/OFF operating the transistor Tr2 is 0.60V. In such case, it is possible to give the time lag T between the ON/OFF of the transistors Tr1 and Tr2, which is in the order of sec as shown in FIG. 2 by setting the time constant on the side of the transistor Tr1 about 18 to 20 times that of the transistor Tr2. Incidentally, a curve A in FIG. 2 is a voltage waveform of the signal for driving the gate of the transistor Tr1 and a curve B is a voltage waveform of the signal for driving the gate of the transistor Tr2. The discharge time constant of the transistor Tr2 shown by the curve B is smaller than one-eighteenth that of the transistor Tr1 shown by the curve A.

As shown in FIG. 1, the time lag drive circuit 124 includes P channel transistors Tr3 and Tr4 and an N channel transistor Tr5, whose source-drain circuits are connected in series in the order and which are provided between the power source line 9 and the ground GND, and a resistor R connected between the source and the drain of the transistor Tr4. The source of the transistor Tr3 is connected to the power source line 9 and the source of the transistor Tr5 is grounded.

It is assumed that an ON resistance of the transistor Tr3 is R3, an ON resistance of the transistor Tr4 is R4, an ON resistance of the transistor Tr5 is R5, a parasitic capacitance between the gate and the source of the transistor Tr1 is C1 and a parasitic capacitance between the gate and the source of the transistor Tr2 is C2=KC1, where K is a coefficient larger than 1.

Assuming that the level shifter 122 generates a rectangular signal "H" or "L" according to the output of the shift register 11, the rectangular signal is supplied to the gates of the transistors Tr1 and Tr2 through the circuits of the time lag drive circuit 124, which have different time constants, respectively. Therefore, the ON/OFF timing of one of the transistors is shifted from that of the other transistor. In this case, the time constants are determined by the parasitic capacitances C1 and C2 (=KC1) between the gates and the sources of the transistors Tr1 and Tr2 and values of the resistors connected to the respective gates.

Conditions under which the time lag drive circuit 124 generates the drive signals having the above mentioned time difference will be described.

When the "L" signal is generated at the output terminal 125a of the CMOS output stage 125, that is, when the output at the output terminal 125a is changed from "H" to "L", the condition is:

$$18 \times C1 \times R3 < KC1 \times (R3+R4) \quad (1)$$

When the "H" signal is generated at the output terminal 125a of the CMOS output stage 125, that is, when the output at the output terminal 125a is changed from "L" to "H", the condition is:

$$C1 \times (R5+R) > 18 \times KC1 \times R5 \quad (2)$$

where R is a resistance value of the resistor R.

It should be noted that, in the above case, the operating time lag T is set by making the time constant for the drive waveform of the transistor Tr2 18 times that of the transistor Tr1.

As to the inequality (1), the term (C1×R3) is the charging time constant of the capacitance C1 when the transistor Tr1 is turned OFF and the term (KC1×(R3+R4)) is the charging time constant of the capacitance C2 when the transistor Tr2 is turned ON. That is, the charging time constant when the transistor Tr1 is turned OFF is smaller than one-eighteenth of the charging time constant when the transistor Tr2 is turned ON. Thus, the transistor Tr1 is turned OFF before the transistor Tr2 is turned ON, resulting in the signal "L" at the output terminal 125a.

As to the inequality (2), the term (C1×(R5+R)) is the discharging time constant of the capacitance C1 when the transistor Tr1 is turned ON and the term (18×KC1×R5) is the discharging time constant of the capacitance C2 when the transistor Tr2 is turned OFF. That is, the discharging time constant when the transistor Tr2 is turned OFF is smaller than one-eighteenth of the charging time constant when the transistor Tr1 is turned ON. Thus, the transistor Tr2 is turned OFF before the transistor Tr1 is turned ON, resulting in the signal "H" at the output terminal 125a.

The first time constant and the second time constant in this invention are determined according to the relation between the resistance value R and the ON resistance value R5 of the transistor Tr5 in the inequality (2). Incidentally, the transistor Tr5 is the third transistor in the present invention. In detail, the first time constant is determined by the resistance value (R5+R) and the second time constant is determined by the resistance value R5. The first and second time constant circuits are operated when the transistor Tr5 is turned ON upon the "H" signal inputted.

The third and fourth time constants in the present invention are determined according to the relation between the ON resistance R3 of the third transistor Tr3 and the ON resistance R4 of the transistor Tr4 in the inequality (1). In detail, the third time constant is determined by the resistance value R3 and the fourth time constant is determined by the resistance value (R3+R4). The transistor Tr3 corresponds to the fourth transistor in the present invention. The third and fourth time constant circuits are operated when the transistors Tr3 and Tr4 are turned ON upon the "L" signal inputted.

This will be described in more detail.

(1) When the output of the level shifter 122 is changed from "H" to "L", the transistors Tr3 and Tr4 of the time lag drive circuit 124 are turned ON and the transistor Tr5 thereof is turned OFF. Therefore, the transistor Tr1 of the CMOS output stage 125 is turned OFF and the transistor Tr2 thereof is turned ON. In such case, the parasitic capacitance C1 of the transistor Tr1 is charged through the time constant circuit composed of the resistance R3 of the transistor Tr3 and the capacitance C1, so that the transistor Tr1 is turned OFF according to the drive signal "H" from the time lag drive circuit 124. The parasitic capacitance C2 of the transistor Tr2 is charged through the time constant circuit composed of the sum of the ON resistance R3 of the transistor Tr3 and the ON resistance R4 of the transistor Tr4 and the capacitance C2 (=KC1), so that the transistor Tr2 is turned ON according to the drive signal "H" from the time lag drive circuit 124. Incidentally, in order to make the resistor R and the resistance R4 of the transistor Tr4 connected in parallel to the resistor R negligible, a relation thereof is set to R4<<R.

By providing the difference of time constant, which is 18 times or more as shown by the inequality (1), between them, it is possible to turn the transistor Tr2 ON after the transistor Tr1 is turned OFF.

(2) When the output of the level shifter 122 is changed from "L" to "H", the transistors Tr3 and Tr4 of the time lag drive circuit 124 are turned OFF and the transistor Tr5 thereof is turned ON. Therefore, the transistor Tr1 of the CMOS output stage 125 is turned ON and the transistor Tr2 thereof is turned OFF. In such case, the parasitic capacitance C1 of the transistor Tr1 is discharged through the time constant circuit composed of the sum of the resistance R of the resistor R and the ON resistance R5 of the transistor Tr5 and the capacitance C1, so that the transistor Tr1 is turned ON according to the drive signal "L" from the time lag drive circuit 124. The parasitic capacitance C2 of the transistor Tr2 is discharged through the time constant circuit composed of the sum of the ON resistance R5 of the transistor Tr5 and the parasitic capacitance C2 (=KC1), so that the transistor Tr2 is turned OFF according to the drive signal "L" from the time lag drive circuit 124.

By providing the difference of time constant, which is 18 times or more as shown by the inequality (2), between them, it is possible to turn the transistor Tr1 ON after the transistor Tr2 is turned OFF. Incidentally, it should be noted that the time difference of 18 times or more results from simulation with the presently available CMOS output stage 125 and it is preferable that the magnification is set in a range from about 15 times to 22 times.

The inequality (1) can be rewritten as follow:

$$R4 > (18-K) \times R3/K \quad (3)$$

and the inequality (2) can be rewritten as follow:

$$R > (18K-1) \times R5 \quad (4)$$

In order to satisfy the inequalities (3) and (4), it is necessary to set the values of the resistances R, R3, R4 and R5. Since, when the difference of time constant is set in the range from about 15 times to about 22 times, the ON resistances R3 and R4 of the P channel transistors as the drive circuit of the usual CMOS output stage 125 are about 500Ω to 1 kΩ and the ON resistance R5 of the N channel transistor thereof is about 100Ω to 250Ω, the value of the resistor R may be in a range from 50 kΩ to 500 kΩ.

Figure 3:
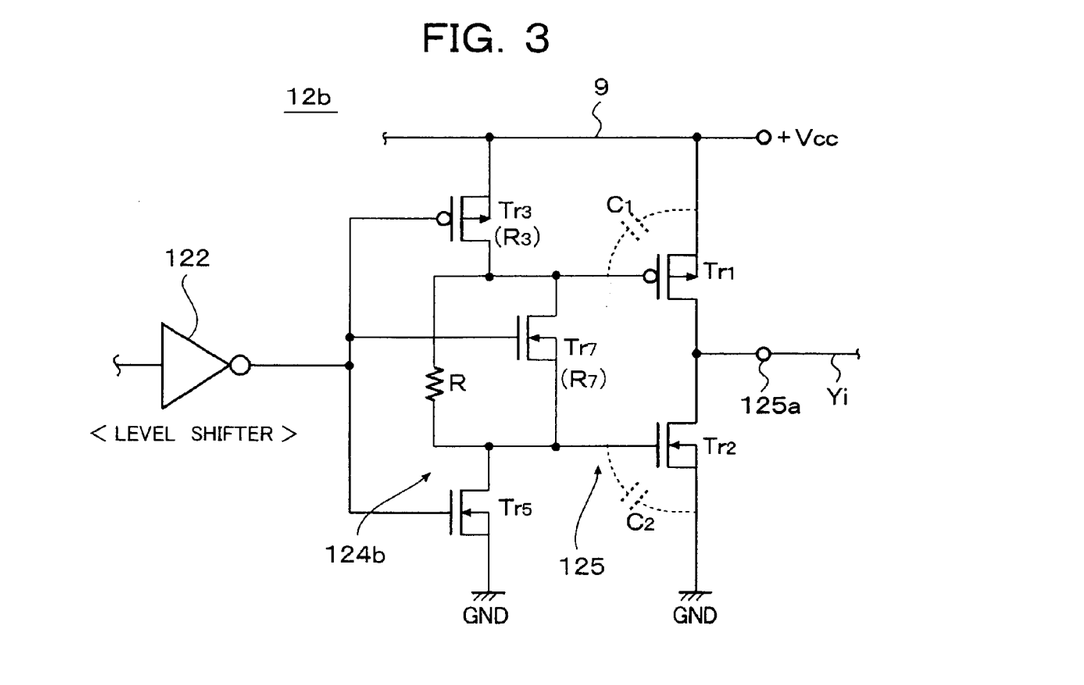
FIG. 3 is a circuit diagram of another embodiment of the current drive circuit.

FIG. 3 is a circuit diagram of another embodiment of the current drive circuit 12b.

The embodiment shown in FIG. 3 differs from the embodiment shown in FIG. 1 in that a time lag drive circuit 124b includes an N channel transistor Tr7 in lieu of the transistor Tr4 of the time lag drive circuit 124 shown in FIG. 1.

An ON/OFF operation of the transistor Tr7 is opposite to that of the transistor Tr4 shown in FIG. 1. Therefore, when the time lag drive circuit 124 outputs "H" in response to the signal "L" and the CMOS output stage 125 outputs the "L", the resistance value of the charging time constant for turning the transistor Tr2 ON becomes (R3+R) since the transistor Tr7 is in OFF state, while the resistance value of the charging time constant for turning the transistor Tr1 OFF is R3. Thus, the time lag is determined according to relations of these resistance values and the gate input capacitances C1 and C2.

When the time lag drive circuit 124 outputs "L" in response to the signal "H" and the CMOS output stage 125 outputs the "H", the resistance value of the discharging time constant for turning the transistor Tr1 ON becomes (R7+R5) since the transistor Tr7 is in ON state, while the resistance value of the discharging time constant for turning the transistor Tr2 OFF is R5. Thus, the delay time is determined according to relations of these resistance values and the gate input capacitances C1 and C2. Incidentally, the resistance value R7 is the ON resistance of the transistor Tr7.

Therefore, when the "H" output is to be generated by the CMOS output stage 125, it is possible to turn the transistor Tr2 OFF precedently to the turning ON of the transistor Tr1 by the difference between the time constant determined by the resistance (R7+R5) and the capacitance C1 and the time constant determined by the resistance R and the capacitance C2.

In the case, the first time constant is determined by the resistance value (R5+R7) and the second time constant is determined by the resistance value R5. The third time constant is determined by the resistance value R3 and the fourth time constant is determined by the resistance value (R3+R).

Incidentally, this circuit is effective when the parasitic capacitance C1 between the gate and the source of the transistor Tr1 is larger than the parasitic capacitance C2 between the gate and the source of the transistor Tr2.

Although detailed description of the operation of this circuit is omitted, the transistor Tr7 shown in FIG. 3 and the transistor Tr4 shown in FIG. 1 are the fifth transistors in this invention, respectively.

Although the case where the time lag drive circuit 124 for driving the CMOS circuit generates the output "H" in response to the signal "L" and the CMOS output stage 125 outputs "L" signal and the case where the time lag drive circuit 124 for driving the CMOS circuit generates the output "L" in response to the signal "H" and the CMOS output stage 125 outputs "H" signal are described, the present invention may be applied to a case where the time lag driving is performed for only the case where the CMOS output stage 125 generates the "H" output for which the feed-through current is considerable.

The level shifter 122 for supplying the "H" or "L" output to the time lag drive circuit 124 is an inverting amplifier in this embodiment. When the inverting amplifier is included in the time lag drive circuit, the input signal of the time lag drive circuit becomes opposite. Therefore, the input signal of the time lag drive circuit may be the logic signal "L" or "H". The inversion of input logic signal can be done by an inverter or by changing the P channel transistor to the N channel transistor or vise versa.

Further, when N channel transistor of the CMOS output stage is turned ON after P channel transistor of the CMOS output stage is turned OFF in response to a predetermined logic signal inputted to a time lag drive circuit, the third and fourth time constants in this embodiment may be used as the first time constant and the second time constant, and when P channel transistor of the CMOS output stage is turned ON after N channel transistor of the CMOS output stage is turned OFF in response to a predetermined logic signal inputted to a time lag drive circuit, the first time constant and the second time constant in this embodiment may be used as the third and fourth time constants.

Further, in this invention, ON resistance of P or N channel transistor in this embodiment may be used in combination with a resistance.

What is claimed is:

1. A display element drive circuit comprising an output stage including a CMOS circuit for driving a line to which a plurality of display elements are connected, wherein said CMOS circuit comprises a first P channel transistor and a second N channel transistor and a drive circuit for driving said first and second transistors, said drive circuit comprising a time constant circuit having a first time constant utilizing a first gate input capacitance of said first transistor and a second time constant utilizing a second gate input capacitance of said second transistor, one of the first and second time constants being selected such that, when said drive circuit receives a predetermined logic signal, one of said first and second transistors is turned ON after the other transistor is turned OFF, wherein when said drive circuit, receives the predetermined logic signal, turns said first transistor ON after said second transistor is turned OFF, the first time constant is larger than the second time constant, the predetermined logic signal is either a High level or a Low level and said time constant circuit includes a first resistor coupled with said first gate input capacitance for determining the first time constant and a second resistor coupled with said second gate input capacitance for determining the second time constant.

2. A display element drive circuit as claimed in claim 1, wherein the predetermined logic signal is the High level, the first time constant is a discharging time constant, which is 15 times the second time constant or more, said first and second resistors are connected in series with each other, at least said second resistor is an ON resistance of a third transistor, the first time constant is determined by the first gate input capacitance and a composite resistance value of said first resistor and the ON resistance of said third transistor, the second time constant is determined by the second gate input capacitance and the ON resistance of said third transistor and said time constant circuit operates when said third transistor is turned ON in response to the High level logic signal.

3. A display element drive circuit as claimed in claim 2, wherein said time constant circuit further has a third time constant utilizing the first gate input capacitance and a fourth time constant utilizing the second gate input capacitance and either the third or fourth time constant is selected such that said second transistor is turned ON after said first transistor is turned OFF, when said drive circuit receives the other logic signal.

4. A display element drive circuit as claimed in claim 3, wherein the fourth time constant is larger than the third time constant and said time constant circuit includes a third resistor coupled with the first gate input capacitance for determining the third time constant and a fourth resistor coupled with the second gate input capacitance for determining the fourth time constant.

5. A display element drive circuit as claimed in claim 4, wherein the fourth time constant is a charging time constant, which is 15 times the third time constant or more, said third and fourth resistors are connected in series with each other, said third resistor is an ON resistance of a fourth transistor, said fourth resistor is an ON resistance of a fifth transistor, the third time constant is determined by the first gate input capacitance and the ON resistance of said fourth transistor, the fourth time constant is determined by the second gate input capacitance and a composite resistance value of the ON resistances of said fourth and fifth transistors and said time constant circuit operates when said fourth and fifth transistors are turned ON in response to the Low level logic signal.

6. A display element drive circuit as claimed in claim 5, wherein one end of said first resistor, which is connected to said third transistor, is connected to a gate of said second transistor, the other end of said first resistor is connected to a gate of said first transistor and said fourth transistor and said fifth transistor is provided in parallel to said first resistor.

7. A display element drive circuit as claimed in claim 6, wherein said third transistor is an N channel transistor, said fourth transistor is a P channel transistor, one end of said first resistor is grounded through said third transistor, the other end of said first resistor is connected to a power source line through said fourth transistor and said fifth transistor is turned ON in response to one of the High and Low levels and OFF in response to the other level.

8. A display element drive circuit as claimed in claim 2, wherein said display element is an organic EL element and a cathode side terminal of said organic EL is connected to said line.

9. A display element drive circuit as claimed in claim 4, wherein said drive circuit includes two P channel transistors having source-drain circuits connected in series and an N channel transistor having a drain connected to the source of a downstream side one of said P channel transistors between a power source line and a ground, said first resistor is one of said P channel transistors, which is not connected to said power source line, said second resistor is an ON resistance of said N channel transistor, said third resistor is an ON resistance of the other of said P channel transistors and said fourth resistor is said one of said P channel transistors.

10. A display element drive circuit as claimed in claim 4, wherein said drive circuit includes a P channel transistor and two N channel transistors having drain-source circuits connected in series to a downstream side of said P channel transistor between a power source line and a ground, said first resistor is an ON resistance of one of said N channel transistors, which is connected to said P channel transistor, said second resistor is an ON resistance of the other of said N channel transistors, said third resistor is an ON resistance of said P channel transistor and said fourth resistor is provided in parallel to said first resistor.

11. A display element drive circuits, comprising an output stage including a CMOS circuit for driving a line to which a plurality of display elements are connected, wherein said CMOS circuit comprises a first P channel transistor and a second N channel transistor and a drive circuit for driving said first and second transistors, said drive circuit comprising a time constant circuit having a first time constant utilizing a first gate input capacitance of said first transistor and a second time constant utilizing a second gate input capacitance of said second transistor, one of the first and second time constants being selected such that, when said drive circuit receives a predetermined logic signal, one of said first and second transistors is turned ON after the other transistor is turned OFF and one of the first and second time constants is selected such that said second transistor is turned ON after said first transistor is turned OFF in response to a predetermined logic signal inputted to said drive circuit, the first time constant is smaller than the second time constant, the predetermined logic signal is either a High level or a Low level and said time constant circuit includes a first resistor coupled with the first gate input capacitance for determining the first time constant and a second resistor coupled with the second gate input capacitance for determining the second time constant.

12. A display element drive circuit as claimed in claim 11, wherein the predetermined logic signal is Low level, the first time constant is a discharging time constant equal to one-fifteenth of the second time constant or smaller, said first and second resistors are connected in series with each other, at least said first resistor is an ON resistance of a third transistor, the first time constant is determined by the first gate input capacitance and the ON resistance of said third transistor, the second time constant is determined by the second gate input capacitance and a sum of the On resistance of said third transistor and said second resistor and said time constant circuit operates when said third transistor is turned ON in response to the Low level signal.

13. A display device including a display element drive circuits, comprising an output stage including a CMOS circuit for driving a line to which a plurality of display elements are connected, wherein said CMOS circuit comprises a first P channel transistor and a second N channel transistor and a drive circuit for driving said first and second transistors, said drive circuit comprising a time constant circuit having a first time constant utilizing a first gate input capacitance of said first transistor and a second time constant utilizing a second gate input capacitance of said second transistor, one of the first and second time constants being selected such that, when said drive circuit receives a predetermined logic signal, one of said first and second transistors is turned ON after the other transistor is turned OFF, wherein said drive circuit, when said drive circuit receives the predetermined logic signal, turns said first transistor ON after said second transistor is turned OFF, the first time constant is larger than the second time constant, the predetermined logic signal is either a High level or a Low level and said time constant circuit includes a first resistor coupled with said first gate input capacitance for determining the first time constant and a second resistor coupled with said second gate input capacitance for determining the second time constant.

14. A display device including a display element drive circuit as claimed in claim 13, wherein the predetermined logic signal is the High level, the first time constant is a discharging time constant, which is 15 times the second time constant or more, said first and second resistors are connected in series with each other, at least said second resistor is an ON resistance of a third transistor, the first time constant is determined by the first gate input capacitance and a composite resistance value of said first resistor and the ON resistance of said third transistor, the second time constant is determined by the second gate input capacitance and the ON resistance of said third transistor and said time constant circuit operates when said third transistor is turned ON in response to the High level logic signal.

15. A display device including a display element drive circuit as claimed in claim 14, wherein said time constant circuit further has a third time constant utilizing the first gate input capacitance and a fourth time constant utilizing the second gate input capacitance and either the third or fourth time constant is selected such that said second transistor is turned ON after said first transistor is turned OFF, when said drive circuit receives the other logic signal.

16. A display device including a display element drive circuit as claimed in claim 15, wherein the fourth time constant is larger than the third time constant and said time constant circuit includes a third resistor coupled with the first gate input capacitance for determining the third time constant and a fourth resistor coupled with the second gate input capacitance for determining the fourth time constant.

17. A display device including a display element drive circuit as claimed in claim 16, wherein the fourth time constant is a charging time constant, which is 15 times the third time constant or more, said third and fourth resistors are connected in series with each other, said third resistor is an ON resistance of a fourth transistor, said fourth resistor is an ON resistance of a fifth transistor, the third time constant is determined by the first gate input capacitance and the ON resistance of said fourth transistor, the fourth time constant is determined by the second gate input capacitance and a composite resistance value of the ON resistances of said fourth and fifth transistors and said time constant circuit operates when said fourth and fifth transistors are turned ON in response to the Low level logic signal.

18. A display device including a display element drive circuit as claimed in claim 17, wherein one end of said first resistor, which is connected to said third transistor, is connected to a gate of said second transistor, the other end of said first resistor is connected to a gate of said first transistor and said fourth transistor and said fifth transistor is provided in parallel to said first resistor.

19. A display device including a display element drive circuit as claimed in claim 18, wherein said third transistor is an N channel transistor, said fourth transistor is a P channel transistor, one end of said first resistor is grounded through said third transistor, the other end of said first resistor is connected to a power source line through said fourth transistor and said fifth transistor is turned ON in response to one of the High and Low levels and OFF in response to the other level.

20. A display device including a display element drive circuit as claimed in claim 13, wherein said display element is an organic EL element and a cathode side terminal of said organic EL is connected to said line.

21. A display device including a display element drive circuit as claimed in claim 16, wherein said drive circuit includes two P channel transistors having source-drain circuits connected in series and an N channel transistor having a drain connected to the source of a downstream side one of said P channel transistors between a power source line and a ground, said first resistor is one of said P channel transistors, which is not connected to said power source line, said second resistor is an ON resistance of said N channel transistor, said third resistor is an ON resistance of the other of said P channel transistors and said fourth resistor is said one of said P channel transistors.

22. A display device including a display element drive circuit as claimed in claim 16, wherein said drive circuit includes a P channel transistor and two N channel transistors having drain-source circuits connected in series to a downstream side of said P channel transistor between a power source line and a ground, said first resistor is an ON resistance of one of said N channel transistors, which is connected to said P channel transistor, said second resistor is an ON resistance of the other of said N channel transistors, said third resistor is an ON resistance of said P channel transistor and said fourth resistor is provided in parallel to said first resistor.

23. A display device including a display element drive circuit as claimed in claim 11.

24. A display device including a display element drive circuit as claimed in claim 12.

* * * * *